(12) United States Patent
Herzum

(10) Patent No.: US 7,262,118 B2
(45) Date of Patent: Aug. 28, 2007

(54) METHOD FOR GENERATING A STRUCTURE ON A SUBSTRATE

(75) Inventor: Christian Herzum, Pöcking (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/062,883

(22) Filed: Feb. 22, 2005

(65) Prior Publication Data
US 2005/0196968 A1    Sep. 8, 2005

Related U.S. Application Data

(63) Continuation of application No. PCT/EP03/09351, filed on Aug. 22, 2003.

(51) Int. Cl.
*H01L 21/425*    (2006.01)
(52) U.S. Cl. ............... 438/514; 438/703; 257/E23.132; 257/E23.134; 257/E21.043; 257/E21.057
(58) Field of Classification Search ............... 438/703, 438/745, 514; 257/E23.132, E23.134, E21.043, 257/E21.057
See application file for complete search history.

(56) References Cited

U.S. PATENT DOCUMENTS 4,732,871 A * 3/1988 Buchmann et al. ......... 438/183
4,868,136 A    9/1989 Ravaglia
4,957,874 A    9/1990 Soejima
5,391,503 A    2/1995 Miwa et al.
5,821,603 A    10/1998 Puntambekar
5,937,319 A    8/1999 Xiang et al.
6,287,930 B1    9/2001 Park
6,291,287 B1    9/2001 Plasa
6,365,497 B1    4/2002 Gonzalez
2001/0013618 A1    8/2001 Oashi et al.
2001/0020717 A1    9/2001 Hai

FOREIGN PATENT DOCUMENTS

DE    36 28 488 A1    3/1987
DE    195 28 991 A1    6/1997

* cited by examiner

*Primary Examiner*—Michelle Estrada
(74) *Attorney, Agent, or Firm*—Maginot, Moore & Beck

(57) ABSTRACT

The invention relates to a method for generating very short gate structures. In a method for generating a structure on a substrate in accordance with one embodiment of the invention, first of all a layer sequence of a first oxide layer, a first nitride layer and a second oxide layer is disposed onto the substrate. Subsequently, a portion of the second oxide layer and a portion of the first nitride layer is removed in order to expose a portion of the first oxide layer. Then, a part of the first nitride layer above the first oxide layer and below the second oxide layer is removed in order to expose the area of the structure.

19 Claims, 4 Drawing Sheets

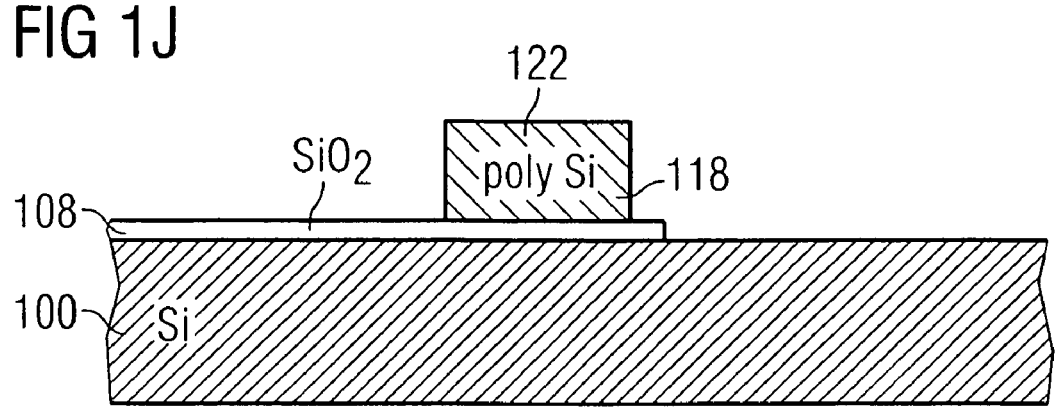
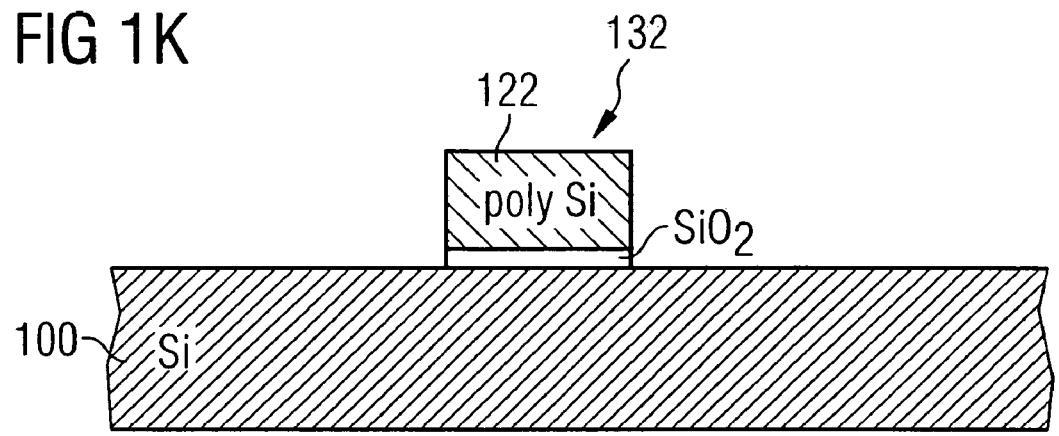

METHOD FOR GENERATING A STRUCTURE ON A SUBSTRATE

CROSS-REFERENCE TO RELATED APPLICATIONS

This application is a continuation of co-pending International Application No. PCT/EP03/09351, filed Aug. 22, 2003, which designated the United States and was not published in English.

FIELD OF THE INVENTION

The present invention relate to a method for generating a structure on a substrate and in particular to a self-aligning method for generating a structure, like for example a shortened gate oxide for an MOS transistor.

BACKGROUND

In some applications for manufacturing semiconductor devices it may be desirable to implement structures having smaller (shorter) dimensions, e.g. in MOS transistors (MOS=metal oxide semiconductor), e.g. LDMOS transistor (LDMOS=laterally diffused metal oxide semiconductor), the gate electrode or the gate oxide, respectively.

In the art, lithography methods are known by use of which (poly) gate electrodes are manufactured. These known methods are not self-aligning, so that limitations based on the limited alignment possibilities of the used illumination instruments result. The disadvantage of the thus manufactured gate structures is that a certain gate length may not be fallen short of and that certain tolerances may not be achieved.

It is a further disadvantage of the conventional methods that a different doping of source areas and drain areas, like it is for example required in an LDMOS transistor or a DMOS transistor, is only hardly possible or not at all possible with short gate structures.

SUMMARY

Based on this prior art it is an object of the present invention to provide an improved method for generating a structure having shorter dimensions on a substrate.

According to one embodiment, the present invention provides a method for generating a structure on a substrate, comprising:

(a) applying a layer sequence of a first oxide layer, a first nitride layer and a second oxide layer onto the substrate;

(b) removing a portion of the second oxide layer and a portion of the first nitride layer in order to expose a portion of the first oxide layer; and (c) removing a part of the first nitride layer in order to determine the area of the structure above the first oxide layer and below the second oxide layer.

According to the present invention the structure is manufactured in a self-aligning way.

Compared to conventional processes the present invention has the advantage that by the self-aligning method smaller gate lengths and/or lower tolerances are possible than may be achieved with conventional methods and the correspondingly present lithography methods.

It is a further advantage of the present invention that the same facilitates a different doping of the source areas and drain areas, as it is for example required in an LDMOS transistor, even with very short gate structures.

BRIEF DESCRIPTION OF THE DRAWINGS

Further embodiments of the present invention are described in detail with respect to the following figures, in which:

FIGS. 1A to 1K show an embodiment of the inventive method.

DETAILED DESCRIPTION

With reference to FIG. 1, now a first preferred embodiment of the present invention is explained in more detail, wherein using FIGS. 1A to 1K the different process steps according to this preferred embodiment are explained in more detail.

Figure 1A:
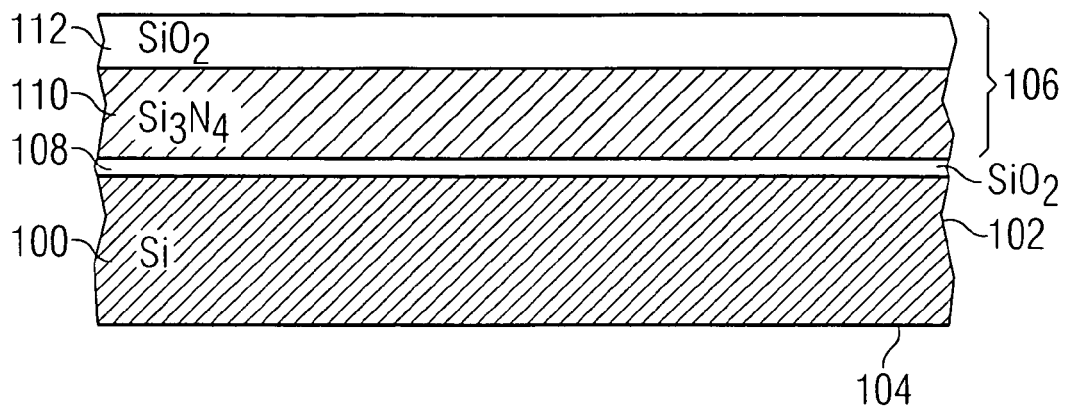

In FIG. 1A a semiconductor structure is illustrated including a substrate 100 comprising a first main surface 102 and a second main surface 104. On the first main surface 102 of the substrate 100, which is a silicon substrate in the illustrated embodiment, a layer sequence 106 is generated including a first oxide layer 108 arranged on the substrate 100, a nitride layer 110 arranged on the first oxide layer 108 and a second oxide layer 112 arranged on the nitride layer 110. In the illustrated embodiment, the oxide layers 108 and 112 are silicon dioxide layers and the nitride layer 110 is a silicon nitride layer. In FIG. 1A the silicon oxide/silicon nitride/silicon oxide sandwich 106 disposed on the basis material (substrate) is illustrated.

Figure 1B:
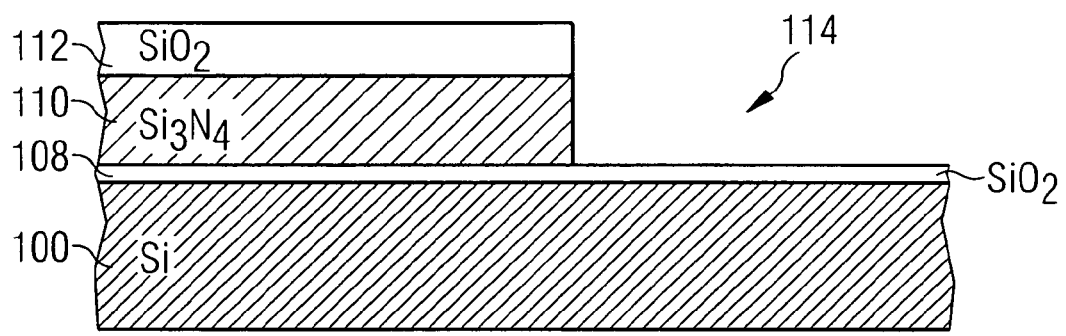

In a subsequent process step the second or top oxide layer 112, respectively, and the first nitride layer 110 are structured using a lithography step and a subsequent etching, whereby the structure illustrated in FIG. 1B results, wherein one portion 114 of the first oxide layer is exposed, so that in this area the surface of the first oxide layer 108 facing away from the substrate 100 is exposed.

Subsequently, the first nitride layer 110 is etched back in a selective wet-chemical way in order to remove a part of the nitride layer below the second oxide layer 112 and above the first oxide layer 108. Hereby, the length of the gate oxide to be generated is set. The wet-chemical selective etching is performed for example using hot phosphoric acid (~80% $H_3PO_4$, T~155° C.) for a time period of e.g. 25 minutes.

Figure 1C:
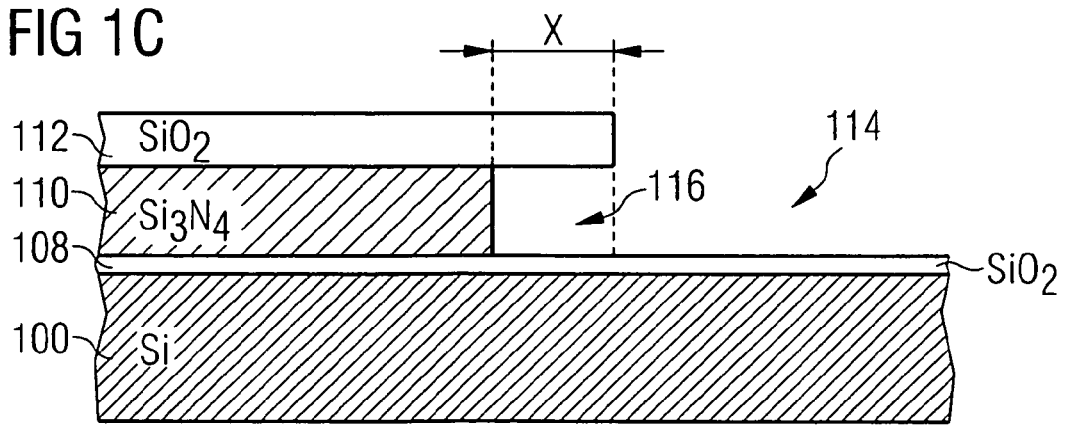

In FIG. 1C the structure resulting after etching the nitride layer 110 is shown. As it may be seen, below the second oxide layer 112 an area 116 is exposed, in which the nitride layer 110 was etched back. X designates the length of the structure to be generated.

Figure 1D:
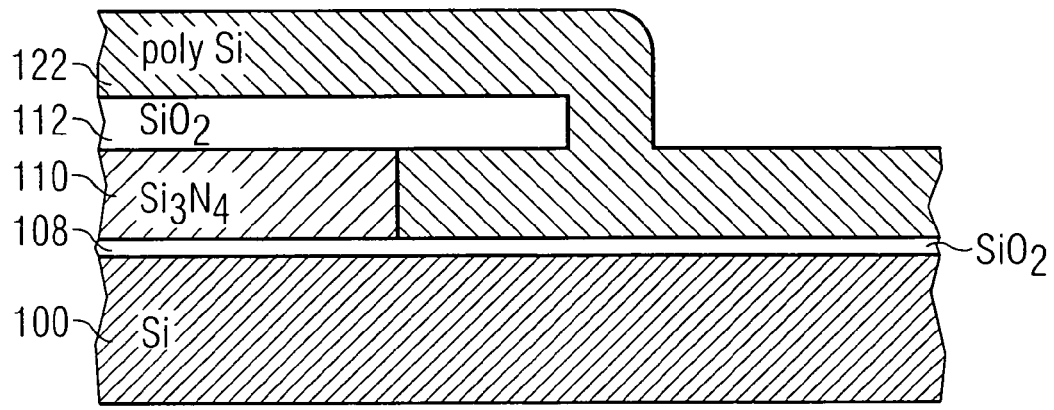
Figure 1E:
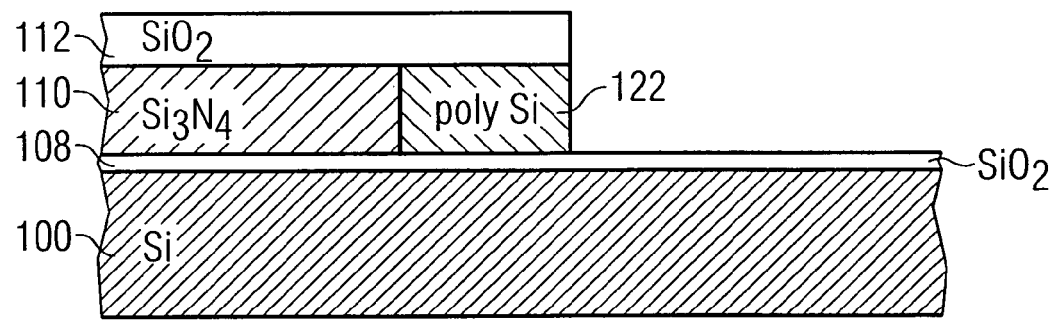

Subsequently, a conforming separation of a polysilicon layer 122 onto the complete surface of the structure is performed, so that the structure illustrated in FIG. 1D results. The polysilicon layer 122 is subsequently etched back to the silicon oxide layers in an anisotropic and selective way, so that the structure illustrated in FIG. 1E results, in which the polysilicon only remains in the area 116. At this point of the manufacturing process there is now the possibility of an implantation, whereby the area lying right of the future gate structure in FIG. 1E (below the exposed first oxide layer 108) is doped, the one lying left of the future gate structure in FIG. 1E, i.e. below the remaining nitride layer 110, in the substrate is not, however.

Figure 1F:
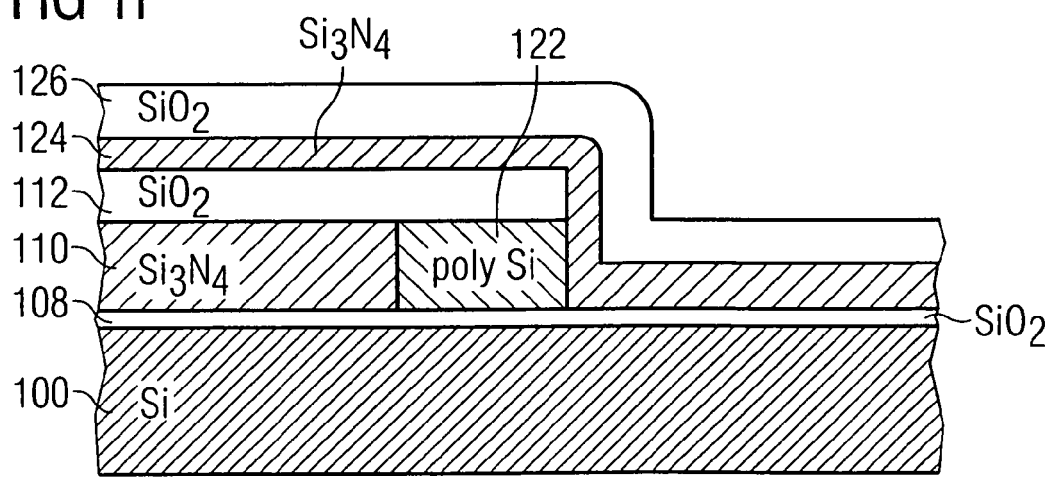

In a further method step, a further silicon nitride layer 124 and a further oxide layer 126 is conformingly separated on the whole face of the structure, so that the structure illustrated in FIG. 1F results.

Figure 1G:
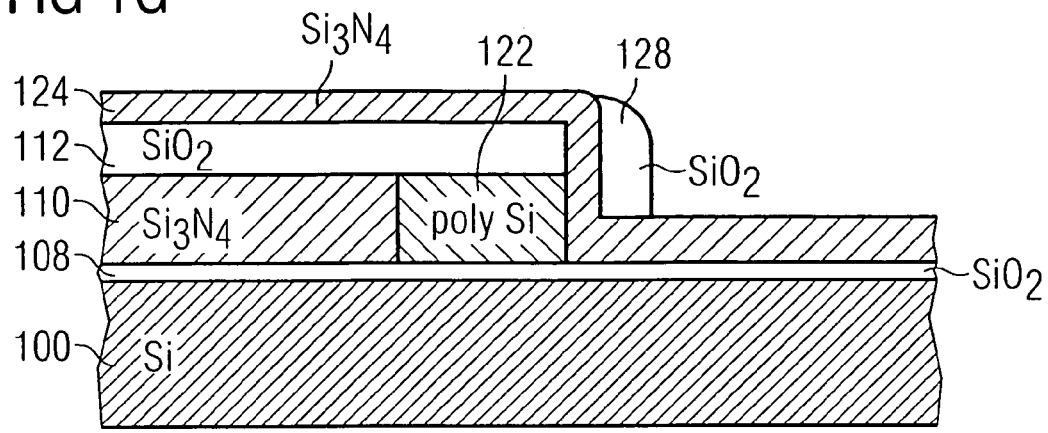

Then, the additional silicon oxide layer 126 is etched back to the silicon nitride in an anisotropic and selective way, so that at the topology stage an oxide residue 128 remains, as it is illustrated in FIG. 1G. The topology stage resulted from the initial exposing of portion 114 and the subsequent filling of the area 116 with the polysilicon.

Figure 1H:
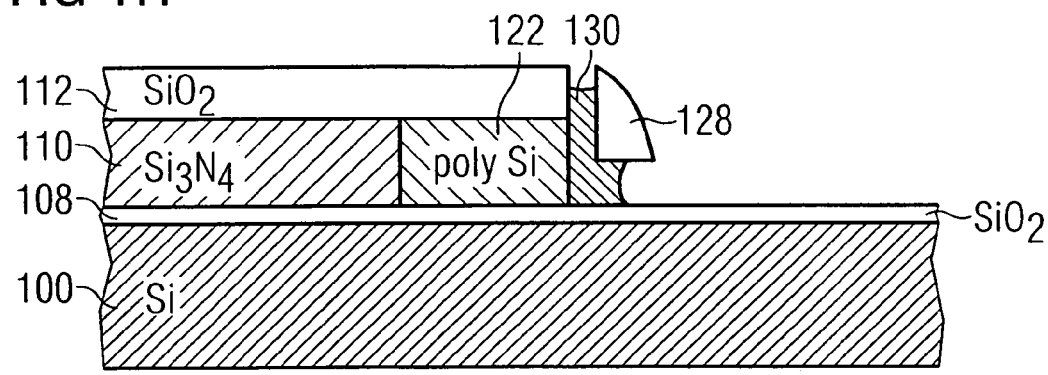

Subsequently, also the silicon nitride layer 124 is selectively etched to the silicon oxide, and in addition to the oxide residue 128 a nitride residue 130 remains at the topology stage, as it is shown in FIG. 1H.

Figure 1I:
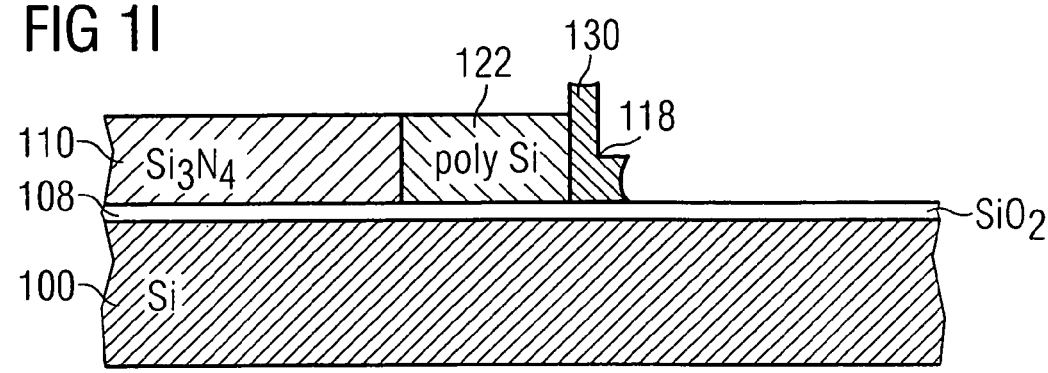

A silicon oxide, i.e. layer 112, and the residue 128 are then etched to the silicon nitride on the whole face and selectively, and are if possible etched selectively to the silicon, so that the structure illustrated in FIG. 1I results.

In the following, the nitride layer 110 and the nitride residue 130 are selectively etched, so that the structure illustrated in FIG. 1J results, wherein subsequently, if necessary, the oxide layer 108 is etched in an anisotropic and selective way to the silicon of the substrate, so that the final structure 132 results, as it is illustrated in FIG. 1K.

In the above description of the preferred embodiment, a silicon substrate 100 was used and the oxide layers are $SiO_2$ layers. The nitride layers are $Si_3N_4$ layers. The present invention is not restricted to these materials, but also other suitable materials for manufacturing the structure may be used, like e.g. organic materials.

Further, the polysilicon gate may be replaced by tungsten. Instead of a silicon substrate also a silicon carbide substrate may be used.

It is the advantage of the present invention, that the same provides a self-aligning method for manufacturing the structure 132 (see FIG. 1K), wherein by the inventive method very short gate structures may be obtained. With regard to the order of magnitude of the gate structure no theoretical limitations exist. According to one embodiment, the gate length is between 0.1 µm and 0.5 µm.

Although the above-mentioned method was described with reference to the manufacturing of a gate oxide layer for an MOS transistor, the present invention is not restricted to this, but rather finds application in any semiconductor structure in which such small structures are required.

As it was described above, the silicon nitride layer 110 is selectively etched in a wet-chemical way, wherein here preferably hot phosphoric acid (~80% $H_3PO_4$, T~155° C.) is used as an etchant with an etching rate of 4 nm/min. In the illustrated embodiments, for the structure a length of approximately 0.1 µm was selected, which is achieved by an etching period of about 25 minutes. In general, the wet-chemical etching using hot phosphoric acid (~80% $H_3PO_4$, T~155° C.) may be performed with an etching rate of 1 nm/min to 20 nm/min for a time period of 1 minute to 400 minutes. Instead of the polysilicon layer another electrically conductive layer may be used.

The present invention is not restricted to the above-described manufacturing steps. Depending on the structures to be generated, individual steps may be modified or omitted or other steps may be inserted.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for generating a structure on a substrate, comprising the following steps:
   (a) applying a layer sequence of a first oxide layer, a first nitride layer and a second oxide layer onto the substrate, the first nitride layer being applied to a surface of the first oxide layer, and the second oxide layer being applied to the first nitride layer;
   (b) removing a portion of the second oxide layer and a portion of the first nitride layer in order to expose a portion of the surface of the first oxide layer;
   (c) removing a part of the first nitride layer above the first oxide layer and below the second oxide layer to form an area for the structure to be generated;
   (d) conformably forming on the second oxide layer and the surface of the first oxide layer exposed by step (b) and (c) an electrically conductive layer; and
   (e) etching the electrically conductive layer to the second oxide layer and to the exposed surface of the first oxide layer in an anisotropic and selective way such that after etching the electrically conductive layer only remains on the area formed in step (c); and
   further comprising, after step (c), performing an implantation with regard to the substrate in order to form a doped area in the portion of the substrate only covered by the portion of the first oxide layer exposed by step (b).

2. The method according to claim 1, wherein the step (c) comprises removing a part of the first nitride layer to form an area that corresponds to the dimensions of the structure to be generated.

3. The method according to claim 1, wherein the step (c) includes a selective wet-chemical etching of the first nitride layer.

4. The method according to claim 3, wherein the wet-chemical etching includes using phosphoric acid with an etching rate of 1 nm/mm to 20 nm/mm for a time period of 1 minute to 400 minutes.

5. The method according to claim 1, wherein the step (b) includes the following steps:
   (b.1) applying and structuring a photo-resist onto the layer sequence in order to determine the portion of the first oxide layer to be exposed; and
   (b.2) etching the second oxide layer and the first nitride layer down to the determined portion of the first oxide layer.

6. A method for generating a structure on a substrate, comprising the following steps:
   (a) applying a layer sequence of a first oxide layer, a first nitride layer and a second oxide layer onto the substrate, the first nitride layer being applied to a surface of the first oxide layer, and the second oxide layer being applied to the first nitride layer;
   (b) removing a portion of the second oxide layer and a portion of the first nitride layer in order to expose a portion of the surface of the first oxide layer;
   (c) removing a part of the first nitride layer above the first oxide layer and below the second oxide layer to form an area for the structure to be generated;
   (d) conformably forming on the second oxide layer and the surface of the first oxide layer exposed by step (b) and (c) an electrically conductive layer; and
   (e) etching the electrically conductive layer to the second oxide layer and to the exposed surface of the first oxide layer in an anisotropic and selective way such that after etching the electrically conductive layer only remains on the area formed in step (c):
   (f) forming a second nitride layer on the second oxide layer and the portion of the first oxide layer exposed by step (b);

(g) forming a third oxide layer on the second nitride layer;
(h) removing the third oxide layer selectively to the second nitride layer, so that an oxide residue of the second oxide layer remains above at least a first portion of the portion of the first oxide layer exposed by step (b);
(i) selectively removing the second nitride layer to the second oxide layer so that a nitride residue of the second nitride layer remains above at least a second portion of the portion of the first oxide layer exposed by step (b);
(j) selectively removing (i) the second oxide layer to the first nitride layer, and (ii) the oxide residue to the nitride residue;
(k) removing the first nitride layer and the nitride residue; and
(l) removing a portion of the first oxide layer that is not directly beneath the area.

7. The method according to claim 1, wherein the structure is a gate oxide of an MOS transistor.

8. The method according to claim 1, wherein the first oxide layer and second oxide layers are SiO$_2$ layers, wherein the first nitride layer is a Si$_3$N$_4$ layer, wherein the substrate is an Si substrate, and wherein the electrically conductive layer is a polysilicon layer.

9. The method according to claim 4, wherein the wet-chemical etching comprises using an etchant having about 80% phosphoric acid (H$_3$PO$_4$) at a temperature of about 155° C.

10. A method of forming a gate structure for a field effect transistor comprising:
a) providing a substrate;
b) forming a first oxide layer on the substrate;
c) forming a first nitride layer on a surface of the first oxide layer;
d) forming a second oxide layer on a surface of the first nitride layer
e) removing a portion of the second oxide layer above a first portion of the substrate:
f) removing a portion of the first nitride layer above the first portion of the substrate to expose a portion of the surface of the first nitride layer;
g) removing a portion of the first nitride layer above a second portion of the substrate such that the portion of the second oxide layer formed above the second portion of the substrate remains above the second portion of the substrate;
h) forming a conductive layer over the second portion of the substrate and beneath the portion of the second oxide layer formed above the second portion of the substrate;
i) removing the portion of the second oxide layer not removed in step e); and
j) removing the portion of the first nitride layer not removed in step f) or step g); and
further comprising,
forming a second nitride layer on the first oxide layer above the first portion of the substrate and on the portion of the second oxide layer not removed in step e);
forming a third oxide layer on the second nitride layer;
removing a portion of the third oxide layer such that a residual portion of the third oxide layer remains above the first portion of the substrate;
removing the portion of the second nitride layer on the portion of the second oxide layer; and
removing the residual portion of the third oxide layer.

11. The method of claim 10, wherein the portion of the first nitride layer above the second portion of the substrate is removed by wet-chemical etching using phosphoric acid at a temperature of about 155° C. for a time period of about 25 minutes.

12. A method for generating a structure on a substrate, comprising the following steps:
a) applying a layer sequence of a first oxide layer, a first nitride layer and a second oxide layer onto the substrate;
b) removing a portion of the second oxide layer and a portion of the first nitride layer in order to expose a portion of the first oxide layer;
c) removing a part of the first nitride layer above the first oxide layer and below the second oxide layer to form an area; and
d) performing an implantation with regard to the substrate in order to form a doped area in the portion of the substrate only covered by the portion of the substrate only covered by the portion of the first oxide layer exposed by step b).

13. A method for generating a structure on a substrate, comprising the following steps:
a) applying a layer sequence of a first oxide layer, a first nitride layer and a second oxide layer onto the substrate;
b) removing a portion of the second oxide layer and a portion of the first nitride layer in order to expose a portion of the first oxide layer;
c) removing a part of the first nitride layer above the first oxide layer and below the second oxide layer to form an area;
d) forming an electrically conductive layer in the area formed by the removal of the part of the first nitride layer;
e) forming a second nitride layer on the second oxide layer and the portion of the first oxide layer exposed by step b);
f) forming a third oxide layer on the second nitride layer;
g) removing the third oxide layer selectively to the second nitride layer, so that an oxide residue of the second oxide layer remains above at least a first portion of the portion of the first oxide layer exposed by step b);
h) selectively removing the second nitride layer to the second oxide layer so that a nitride residue of the second nitride layer remains above at least a second portion of the portion of the first oxide layer exposed by step b);
i) selectively removing (1) the second oxide layer to the first nitride layer, and (2) the oxide residue to the nitride residue;
j) removing the first nitride layer and the nitride residue; and
k) removing a portion of the first oxide layer that is not directly beneath the area.

14. A method of forming a transistor comprising:
a) providing a substrate;
b) forming a first oxide layer on the substrate;
c) forming a first nitride layer on the first oxide layer;
d) forming a second oxide layer on the first nitride layer;
e) removing a portion of the second oxide layer above a first portion of the substrate;
f) removing a portion of the first nitride layer above the first portion of the substrate;
g) removing a portion of the first nitride layer above a second portion of the substrate such that the portion of the second oxide layer formed above the second portion of the substrate remains above the second portion of the substrate;

h) forming a conductive layer over the second portion of the substrate and beneath the portion of the second oxide layer formed above the second portion of the substrate;

i) forming a second nitride layer on the first oxide layer above the first portion of the substrate and on the portion of the second oxide layer not removed in step e);

j) forming a third oxide layer on the second nitride layer;

k) removing a portion of the third oxide layer such that a residual portion of the third oxide layer remains above the first portion of the substrate;

l) removing a portion of the second nitride layer on the portion of the second oxide layer;

m) removing the residual portion of the third oxide layer;

n) removing a portion of the second oxide layer not removed in step e);

o) removing a portion of the second nitride layer not removed in step l); and p) removing a portion of the first nitride layer not removed in step f) or step g).

15. The method of claim 14, wherein the portion of the first nitride layer above the second portion of the substrate is removed by wet-chemical etching using phosphoric acid at a temperature of about 155° C. for a time period of about 25 minutes.

16. The method according to claim 6, wherein the step (c) includes a selective wet-chemical etching of the first nitride layer.

17. The method according to claim 16, wherein the wet-chemical etching includes using phosphoric acid with an etching rate of 1 nm/mm to 20 nm/mm for a time period of 1 minute to 400 minutes.

18. The method according to claim 17, wherein the wet-chemical etching comprises using an etchant having about 80% phosphoric acid ($H_3PO_4$) at a temperature of about 155° C.

19. The method according to claim 6, wherein the first oxide layer and second oxide layers are $SiO_2$ layers, wherein the first nitride layer is a $Si_3N_4$ layer, wherein the substrate is an Si substrate, and wherein the electrically conductive layer is a polysilicon layer.

* * * * *